United States Patent
Kim

(10) Patent No.: US 8,362,795 B2
(45) Date of Patent: Jan. 29, 2013

(54) SEMICONDUCTOR DEVICE CAPABLE OF VERIFYING RELIABILITY

(75) Inventor: Doo-Young Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 275 days.

(21) Appl. No.: 12/779,283

(22) Filed: May 13, 2010

(65) Prior Publication Data

US 2010/0301894 A1 Dec. 2, 2010

(30) Foreign Application Priority Data

May 27, 2009 (KR) .................. 10-2009-0046556

(51) Int. Cl.
*G01R 31/26* (2006.01)
(52) U.S. Cl. ................................. 324/762.01
(58) Field of Classification Search .. 324/762.01–762.1, 324/750.1–750.3; 257/48; 438/14–18
See application file for complete search history.

(56) References Cited

U.S. PATENT DOCUMENTS

| 5,973,981 A | 10/1999 | Lee |
| 6,734,693 B2 * | 5/2004 | Nakayama ............... 324/750.15 |
| 7,518,390 B2 * | 4/2009 | Saitou et al. ............... 324/750.3 |
| 2007/0109699 A1 * | 5/2007 | Ito et al. ......................... 361/56 |

FOREIGN PATENT DOCUMENTS

| JP | 07-130803 | 5/1995 |
| KR | 1998-034731 | 8/1998 |
| KR | 100283114 | 12/2000 |
| KR | 1020030090880 | 12/2003 |
| KR | 1020070073274 | 7/2007 |

* cited by examiner

*Primary Examiner* — Tung X Nguyen
(74) *Attorney, Agent, or Firm* — F. Chau & Associates, LLC

(57) ABSTRACT

A semiconductor device includes an integrated semiconductor circuit unit, a chip guard-ring disposed along an outer portion of the semiconductor device, and a reliability verifying unit disposed between the integrated semiconductor circuit unit and the chip guard-ring. The reliability verifying unit is configured to delay a reliability verifying signal to detect a fault while in a reliability detecting mode.

18 Claims, 5 Drawing Sheets

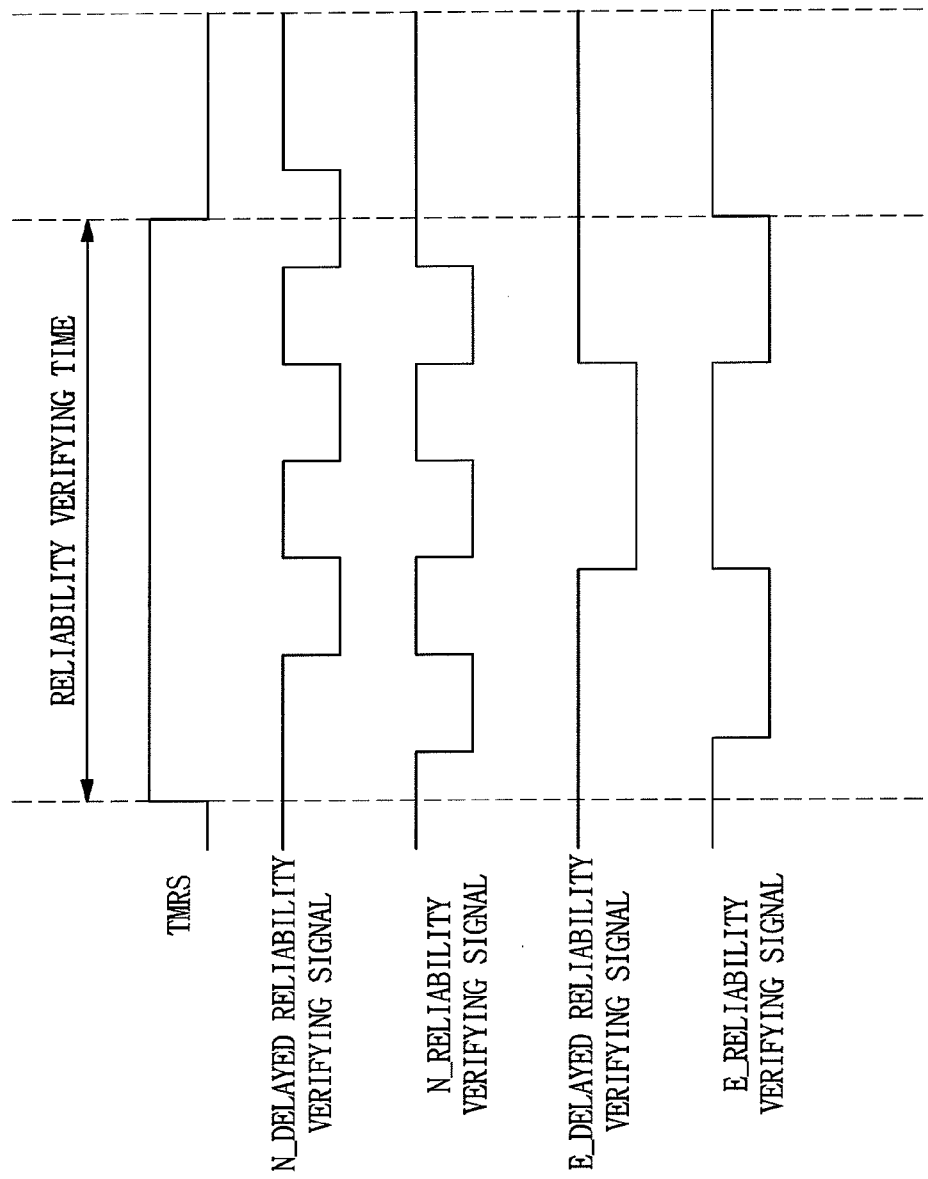

US 8,362,795 B2

SEMICONDUCTOR DEVICE CAPABLE OF VERIFYING RELIABILITY

PRIORITY STATEMENT

This application claims the benefit of priority under 35 U.S.C. §119 from Korean Patent Application No. 10-2009-0046556, filed on May 27, 2009, the contents of which are incorporated by reference herein in its entirety.

BACKGROUND

1. Technical Field

Exemplary embodiments of the present inventive concept relate to a semiconductor device capable of verifying the reliability of a semiconductor chip by detecting a fault in the chip resulting from physical impact occurring during a semiconductor chip fabrication process, and more particularly, to a semiconductor device capable of verifying the reliability of a semiconductor chip by using a reliability-verifying-signal transmitting unit disposed within a surrounding chip guard-ring or a bonding pad area, and measuring and comparing the state of a reliability verifying signal and a change of the period of the signal before and after physical impact occurs.

2. Discussion of Related Art

As the amount of information to be stored in semiconductor devices increases, the capacity and speed of semiconductor devices must increase accordingly. To meet these increased capacity and speed requirements, semiconductor materials having a low dielectric constant (k), which increase the operation frequency of the semiconductor device, may be used. However, material having a low dielectric constant may be porous, and thus, may be easily damaged by physical impact to the semiconductor chip occurring during the semiconductor chip fabrication process. Thus, physical impact applied to the semiconductor chip as a result of, for example, sawing and bonding processes, may damage the semiconductor device.

SUMMARY

According to an exemplary embodiment of the present inventive concept, a semiconductor device includes an integrated semiconductor circuit unit, a chip guard-ring disposed along an outer portion of the semiconductor device, and a reliability verifying unit disposed between the integrated semiconductor circuit unit and the chip guard-ring. The reliability verifying unit is configured to delay a reliability verifying signal to detect a fault while in a reliability detecting mode.

In an exemplary embodiment, the semiconductor device may be configured to detect a pulse-width variation of the reliability verifying signal.

In an exemplary embodiment, the reliability verifying unit may include a reliability-verifying-signal generating unit configured to generate the reliability verifying signal in response to a test mode signal, a reliability-verifying-signal transmitting unit configured to receive the reliability verifying signal from the reliability-verifying-signal generating unit, delay the reliability verifying signal, and transmit the delayed reliability verifying signal to an input of the reliability-verifying-signal generating unit, and a reliability-verifying-signal outputting unit configured to transmit the delayed reliability verifying signal to an output pad of the integrated semiconductor circuit unit.

In an exemplary embodiment, the reliability-verifying-signal transmitting unit comprises at least one inverter and at least one electrical conductor connected in series.

In an exemplary embodiment, the reliability-verifying-signal transmitting unit further comprises at least one NMOS transistor having a drain connected to an input of the at least one inverter, a source connected to a ground voltage, and a gate connected to an electromigration mode signal, wherein the NMOS transistor applies a signal having a logic low state to the input of the at least one inverter while in an electromigration acceleration mode.

In an exemplary embodiment, the reliability-verifying-signal transmitting unit is further disposed at at least one of a lower portion or a neighboring portion of a pad of the integrated semiconductor circuit unit.

In an exemplary embodiment, the semiconductor device further comprises a plurality of layers and the reliability-verifying-signal transmitting unit is disposed at each of the plurality of layers.

In an exemplary embodiment, the reliability-verifying-signal generating unit comprises a NAND gate.

In an exemplary embodiment, the NAND gate comprises a first input connected to the test mode signal, a second input connected to a first inverter of the reliability-verifying-signal transmitting unit, and an output connected to a second inverter of the reliability-verifying-signal transmitting unit.

In an exemplary embodiment, the reliability-verifying-signal outputting unit further comprises a buffer connected to the output pad.

According to an exemplary embodiment of the present inventive concept, a method of verifying reliability of a semiconductor device comprises generating a reliability verifying signal, transmitting the reliability verifying signal to a reliability-verifying-signal transmitting unit, delaying the reliability verifying signal, and transmitting the delayed reliability verifying signal to a reliability-verifying-signal generating unit.

In an exemplary embodiment, the method further comprises comparing a delayed reliability verifying signal from the semiconductor device while operating in a normal state with a delayed reliability verifying signal from the semiconductor device while operating in an abnormal state, wherein the normal state corresponds to the semiconductor device having no abnormalities and the abnormal state corresponds to the semiconductor device having at least one abnormality.

In an exemplary embodiment, the method further comprises comparing a period of the delayed reliability verifying signal from the semiconductor device while operating in the normal state with a period of the delayed reliability verifying signal from the semiconductor device while operating in an abnormal state.

In an exemplary embodiment, the reliability verifying signal has a logic high state while a test mode signal has a logic low state.

In an exemplary embodiment, the reliability verifying signal has one of a logic high state or a logic low state while a test mode has a logic high state.

In an exemplary embodiment, the delayed reliability verifying signal is inverted by the reliability-verifying-signal transmitting unit while a test mode has a logic high state.

In an exemplary embodiment, an electromigration acceleration mode is enabled upon the reliability-verifying-signal transmitting unit receiving an electromigration mode signal having a logic high state.

In an exemplary embodiment, a continuous current flow is applied to the reliability-verifying-signal transmitting unit while in the electromigration acceleration mode.

In an exemplary embodiment, the electromigration acceleration mode is enabled for a predetermined time.

BRIEF DESCRIPTION OF THE DRAWINGS

The above and other features of the present inventive concept will become more apparent by describing in detail exemplary embodiments thereof with reference to the accompanying drawings in which:

FIG. 5 is a timing diagram illustrating the respective states of various signals transmitted through a reliability verifying unit during a reliability detecting mode according to an exemplary embodiment of the present inventive concept.

DETAILED DESCRIPTION OF EXEMPLARY EMBODIMENTS

Exemplary embodiments of the present inventive concept are described more fully hereinafter with reference to the accompanying drawings. This inventive concept may, however, be embodied in many alternate forms and should not be construed as limited to the exemplary embodiments set forth herein. Like numbers refer to like elements throughout the description of the figures.

It will be understood that when an element is referred to as being "connected" or "coupled" to another element, it can be directly connected or coupled to the other element or intervening elements may be present.

Figure 1:
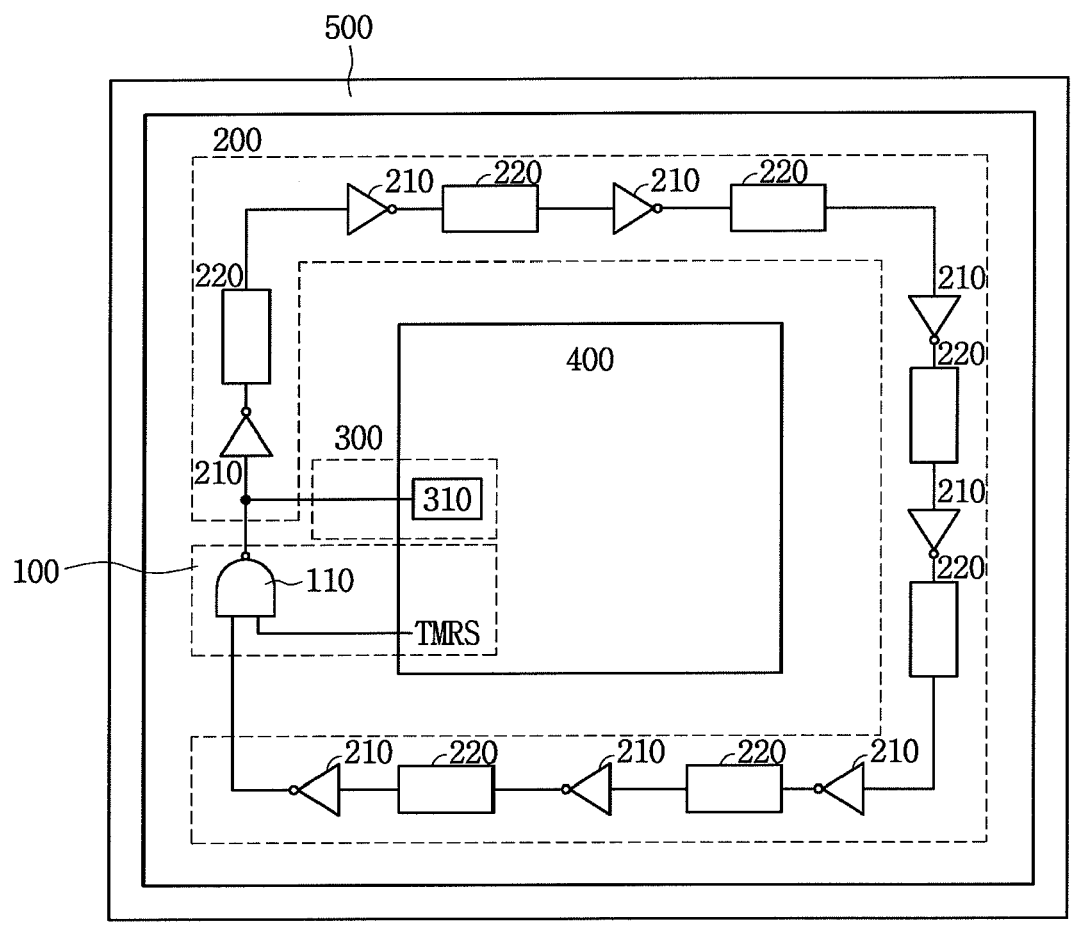
FIG. 1 is a diagram illustrating a semiconductor device having a reliability verifying unit according to an exemplary embodiment of the present inventive concept.

FIG. 1 is a diagram illustrating a semiconductor device having a reliability verifying unit according to an exemplary embodiment of the present inventive concept.

The semiconductor device according to the exemplary embodiment includes an integrated semiconductor circuit unit 400, a chip guard-ring 500, and a reliability verifying unit.

The chip guard-ring 500 is an area of the semiconductor device disposed along an outer portion of a chip area. The chip guard-ring 500 electrically isolates each chip from a scribe lane. A scribe lane is an area that divides a plurality of chips on a wafer into separate chips. A scribe lane may be formed, for example, by a sawing process.

The reliability verifying unit includes a reliability-verifying-signal generating unit 100, a reliability-verifying-signal transmitting unit 200 and a reliability-verifying-signal outputting unit 300.

The reliability-verifying-signal generating unit 100 includes a NAND gate 110. The NAND gate 110 has a first input connected to a test mode signal TMRS, a second input connected to an inverter 210 of the reliability-verifying-signal transmitting unit 200, and an output connected to another inverter 210 of the reliability-verifying-signal transmitting unit 200, as illustrated in FIG. 1. When the test mode signal TMRS is in a logic low state, the NAND gate 110 outputs a signal having a logic high state. When the test mode signal TMRS is in a logic high state, the NAND gate 110 outputs a signal having either a logic high state or a logic low state based on the signal received at the input terminal of the NAND gate 110 connected to the reliability-verifying-signal transmitting unit 200. When the test mode signal TMRS is in the logic high state, reliability of the semiconductor device is verified, and the output signal output from the NAND gate 110 is referred to as a reliability verifying signal. The reliability verifying signal is delayed by the reliability-verifying-signal transmitting unit 200 and input to an input terminal of the NAND gate 110. The delayed output signal is referred to as a delayed reliability verifying signal. The NAND gate 110 inverts the delayed reliability verifying signal to output the reliability verifying signal when the test mode signal TMRS is in the logic high state.

The reliability-verifying-signal transmitting unit 200 includes electrical conductors 220 and inverters 210. The electrical conductors 220 and the inverters 210 may be connected in series repeatedly, as shown in FIG. 1. The electrical conductors 220 and the inverters 210 delay and transmit the reliability verifying signal.

When a semiconductor is fabricated using a material having a low dielectric constant, a physical impact applied to the semiconductor may result in abnormalities such as, for example, cracks, peeling, chipping and delamination. When abnormalities are present, the flow of electrons in the semiconductor changes and the signal transmission is different from the signal transmission of a properly fabricated semiconductor having no abnormalities. As a result, any abnormalities present in a tested semiconductor can be discovered by comparing the signal transmission operation and period of the tested semiconductor with the signal transmission operation and period of a properly fabricated semiconductor having no abnormalities. For example, when abnormalities such as, for example, cracks, peeling, chipping and delamination are generated due to a physical impact caused by, for example, a sawing or bonding process affecting the electrical conductors 220 and the inverters 210 of the reliability-verifying-signal transmitting unit 200, the delayed reliability verifying signal may be different from the normal delayed reliability verifying signal. As a result, abnormalities in the semiconductor may be discovered by comparing the signal transmission operation and period before sawing and bonding processes are performed with the signal transmission operation and period after the sawing and bonding processes are performed.

In an exemplary embodiment, the reliability-verifying-signal transmitting unit 200 may be constructed using only the electrical conductors 220, since the electrical conductors 220 may occupy more area than the inverters 210.

The reliability-verifying-signal outputting unit 300 includes an output pad 310 connected to a node of the reliability-verifying-signal transmitting unit 200. The reliability verifying signal is output to the output pad 310. The reliability verifying signal may be output to a buffer (not shown) connected to the output pad 310.

In an exemplary embodiment, the reliability-verifying-signal transmitting unit 200 may be disposed between the integrated semiconductor circuit unit 400 and the chip guard-ring 500 for verifying reliability of the semiconductor.

Figure 2:
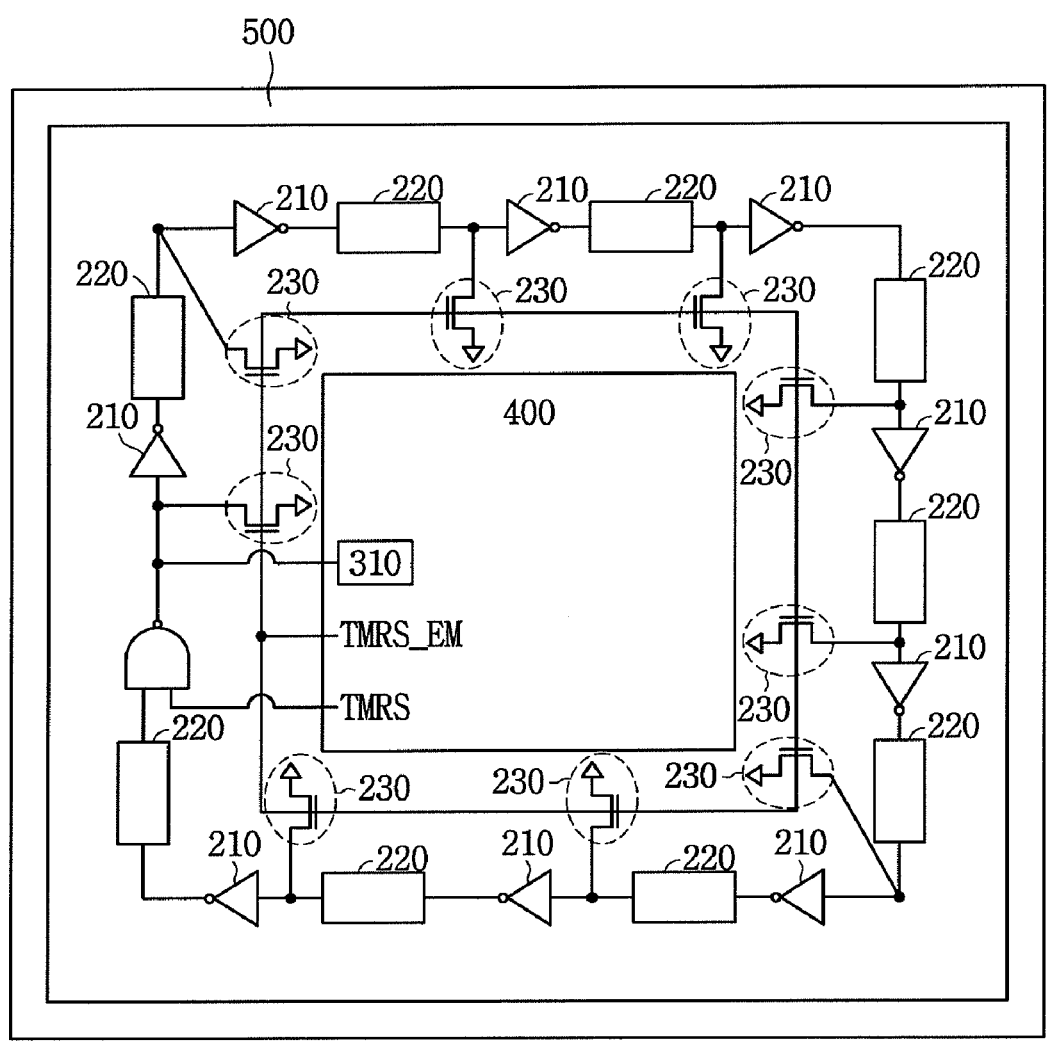
FIG. 2 is a diagram illustrating a semiconductor device having a reliability verifying unit for accelerating electromigration using an NMOS transistor according to an exemplary embodiment of the present inventive concept.

FIG. 2 is a diagram illustrating a semiconductor device having a reliability verifying unit for accelerating electromigration using an NMOS transistor 230 coupled to a reliability-verifying-signal transmitting unit 200 according to an exemplary embodiment of the present inventive concept.

When a small crack exists in a semiconductor device, the semiconductor device may operate normally for a period of time, however, the size of the crack may become larger as time passes, resulting in a fault. Accelerating electromigration enlarges small cracks in a short period of time, allowing faults to be identified during testing. Electromigation can be accelerated by applying a continuous current flow to the reliability-verifying-signal transmitting unit 200.

Hereinafter, a device and method of accelerating electromigration using NMOS transistors 230 in the reliability-verifying-signal transmitting unit 200 will be described, according to an exemplary embodiment of the inventive concept.

In FIG. 2, the reliability-verifying-signal transmitting unit 200 further comprises a plurality of NMOS transistors 230 connected to a plurality of nodes at the inputs of the inverters 210. Each NMOS transistor 230 applies a signal having a logic low state to the connected inverter 210 when the NMOS transistor 230 is turned on. As a result, a current constantly flows through the electrical conductor 220 and electromigration is accelerated. A drain of each NMOS transistor 230 is connected to a node at the input of each inverter 210 of the reliability-verifying-signal transmitting unit 200. A source of each NMOS transistor 230 is connected to ground. An electromigration acceleration mode signal TMRS_EM is applied to gates of the NMOS transistors 230. When the electromigration acceleration mode signal TMRS_EM is in a logic high state, the NMOS transistors 230 are turned on and an input signal of each of the inverters 210 is in a logic low state. This results in current flowing through the electrical conductors 220, which causes electromigration to be accelerated. Once electromigration is accelerated for a predetermined period of time, the electromigration acceleration mode signal TMRS_EM is changed to a logic low state, turning off the NMOS transistors 230 and ending electromigration acceleration. The test mode signal TMRS is then applied to generate the reliability verifying signal and verify reliability of the semiconductor device.

Figure 3:
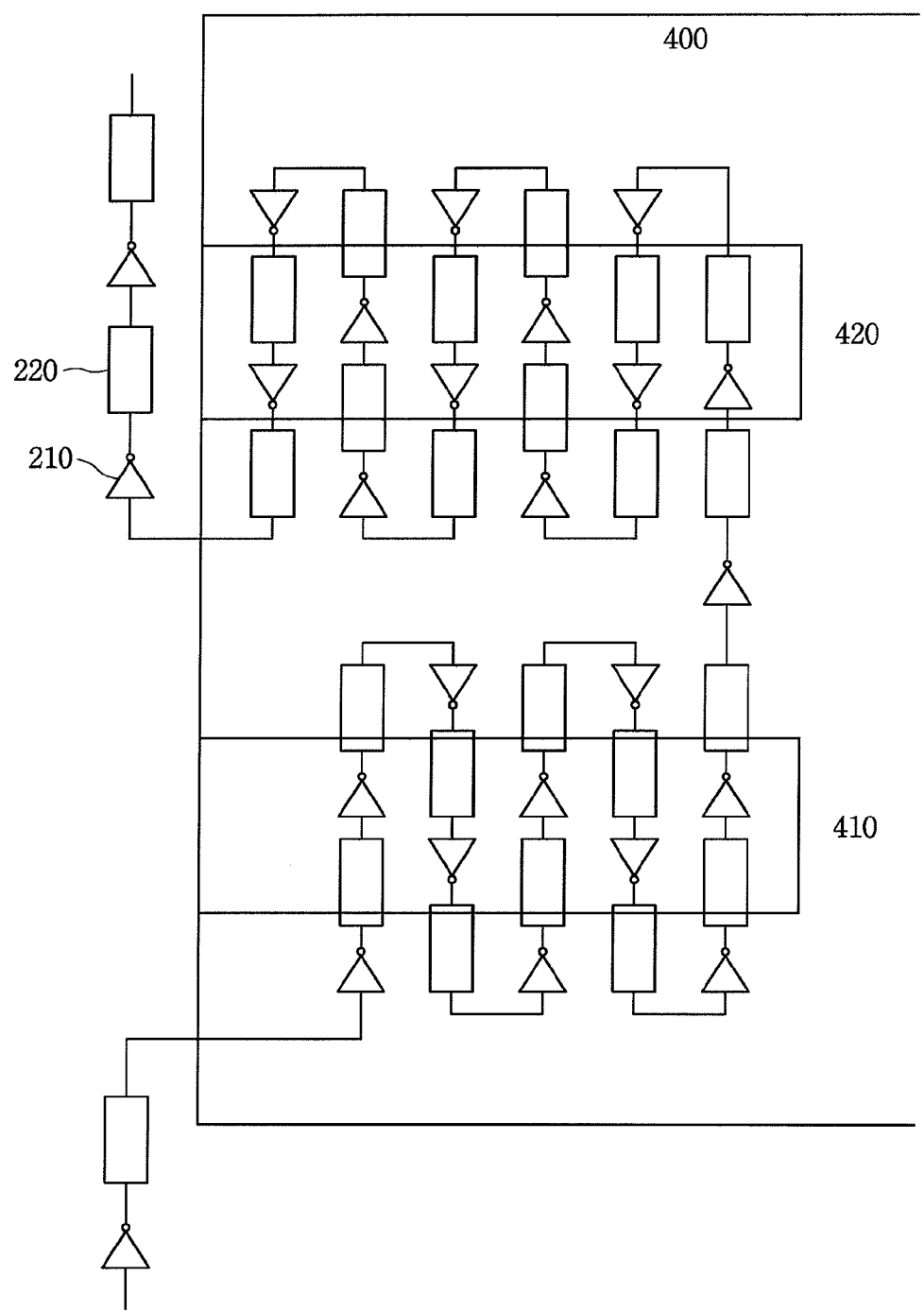
FIG. 3 is a diagram illustrating a semiconductor device having a reliability-verifying-signal transmitting unit disposed at a lower portion and a neighboring portion of each pad of an integrated semiconductor circuit unit according to an exemplary embodiment of the present inventive concept.

FIG. 3 is a diagram illustrating a semiconductor device having a reliability-verifying-signal transmitting unit 200 disposed at a lower portion and a neighboring portion of each pad 410, 420 of an integrated semiconductor circuit unit 400 according to an exemplary embodiment of the present inventive concept.

In FIG. 3, pads 410 and 420 included in the integrated semiconductor circuit unit 400 are shown. Although the exemplary embodiment illustrated in FIG. 3 shows a semiconductor circuit 400 having two pads, the number of pads is not limited thereto.

The pads 410 and 420 may be connected to wires of packages using, for example, a bonding process. In the bonding process, a fault may occur as a result of a direct physical impact applied to each of the pads 410 and 420.

The semiconductor device according to the exemplary embodiment shown in FIG. 3 may detect a fault caused by the physical impact on the pads 410 and 420 by further including the reliability-verifying-signal transmitting unit 200 at a lower portion or neighboring portion of each of pads 410 and 420 of the integrated semiconductor circuit unit 400, as illustrated in FIG. 3. For example, a fault may be detected using the electrical conductors 220 and the inverters 210, which are connected in series repeatedly between each of the pads 410 and 420.

Figure 4:
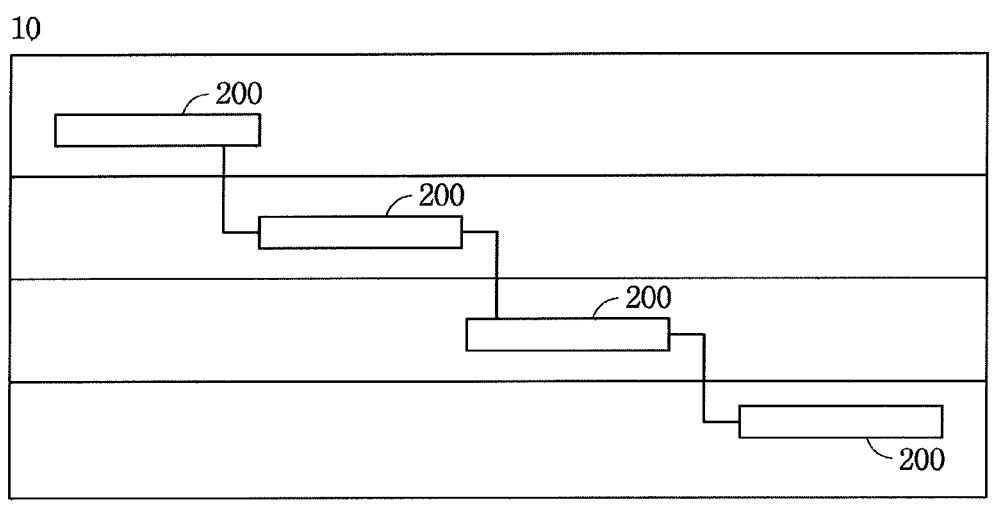
FIG. 4 is a diagram illustrating a semiconductor device comprised of a plurality of layers having a reliability-verifying-signal transmitting unit disposed at each layer of the semiconductor device according to an exemplary embodiment of the present inventive concept.

FIG. 4 is a diagram illustrating a semiconductor device 10 comprised of a plurality of layers having a reliability-verifying-signal transmitting unit 200 disposed at each layer of the semiconductor device 10 according to an exemplary embodiment of the present inventive concept.

When a semiconductor device 10 comprises a plurality of layers, the semiconductor device may include the reliability-verifying-signal transmitting unit 200 at each of the layers. As a result, a fault in a circuit disposed at each of the layers can be detected. The reliability-verifying-signal transmitting units 200 disposed at each of the layers are connected in series repeatedly, as illustrated in FIG. 1.

FIG. 5 is a timing diagram illustrating the respective states of various signals transmitted through a reliability verifying unit such as, for example, the unit illustrated in FIGS. 1 and 2, during a reliability detecting mode according to an exemplary embodiment of the present inventive concept.

When the test mode signal TMRS is in a logic high state, the reliability of the semiconductor device is verified, as shown in FIG. 5.

In a normal state (e.g., a semiconductor device having no abnormalities), the reliability verifying signal is output from the reliability-verifying-signal generating unit 100 and input to the reliability-verifying-signal transmitting unit 200. In the normal state, the reliability verifying signal is referred to as N_RELIABILITY VERIFYING SIGNAL. N_RELIABILITY VERIFYING SIGNAL is delayed and transmitted through the reliability-verifying-signal transmitting unit 200, and is input to the reliability-verifying-signal generating unit 100 as N_DELAYED RELIABILITY VERIFYING SIGNAL.

In an abnormal state (e.g., a semiconductor device having abnormalities), the reliability verifying signal is output from the reliability-verifying-signal generating unit 100 and input to the reliability-verifying-signal transmitting unit 200. In the abnormal state, the reliability verifying signal is referred to as E_RELIABILITY VERIFYING SIGNAL. E_RELIABILITY VERIFYING SIGNAL is delayed and transmitted through the reliability-verifying-signal transmitting unit 200, and is input to the reliability-verifying signal generating unit 100 as E_DELAYED RELIABILITY VERIFYING SIGNAL. As shown in FIG. 5, E_RELIABILITY VERIFYING SIGNAL and E_DELAYED RELIABILITY VERIFYING SIGNAL have a different signal operation and period from N_RELIABILITY VERIFYING SIGNAL and N_DELAYED RELIABILITY VERIFYING SIGNAL, respectively. The different signal operation and period are the result of a delay in the signal transmission due to a fault.

As shown in FIG. 5, the reliability of the semiconductor device is verified while the test mode signal TMRS is in a logic high state. In the normal state, the reliability-verifying-signal generating unit 100 outputs N_RELIABILITY VERIFYING SIGNAL, which is toggled based on the state of N_DELAYED RELIABILITY VERIFYING SIGNAL, which is input to the reliability-verifying-signal generating unit 100. The abnormal state is entered when a fault is generated in the electrical conductors 220 of the reliability-verifying-signal transmitting unit 200 due to, for example, a physical impact.

In the abnormal state, the reliability-verifying-signal generating unit 100 outputs E_RELIABILITY VERIFYING SIGNAL, which is toggled based on the state of E_DELAYED RELIABILITY VERIFYING SIGNAL, which is input to the reliability-verifying-signal generating unit 100. As shown in FIG. 5, E_DELAYED RELIABILITY VERIFYING SIGNAL has a greater delay than N_DELAYED RELIABILITY VERIFYING SIGNAL. Therefore, if a fault is generated by, for example, a sawing or bonding process, the fault can be identified by detecting a change of the period of the reliability verifying signal output from the reliability-verifying-signal generating unit 100 and input to the reliability-verifying-signal outputting unit 300. For example, a fault can be identified by detecting a change of the period of N_DELAYED RELIABILITY VERIFYING SIGNAL, output before the sawing or bonding process, and E_DELAYED RELIABILITY VERIFYING SIGNAL, output after the sawing or bonding process. The detected change of the period indicates the generation of a fault in the semiconductor chip.

In an exemplary embodiment, the number of the inverters 210 of the reliability-verifying-signal transmitting unit 200 may be odd and a ring oscillator may be constructed, resulting in a different state of reliability verifying signals being generated based on the state of the delayed reliability verifying signal.

In another exemplary embodiment, the reliability-verifying-signal transmitting unit 200 may include an open loop having an even number of inverters 210. In this exemplary embodiment, a signal delay in a chain including inverters 210 and electrical conductors 220 may be measured, and the generation of a fault may be identified by detecting an abnormality in the signal operation and a delay change when the signal is measured after physical impact occurs.

The level of each signal may be changed according to the configuration of the reliability verifying unit 200.

In the described exemplary embodiments, the failure rate of semiconductor devices can be decreased by detecting a fault in a semiconductor device caused by, for example, physical impact. When a small crack exists, detection of a fault resulting from the small crack can prevent the fault from being generated during mass production.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
   an integrated semiconductor circuit unit;
   a chip guard-ring disposed along an outer portion of the semiconductor device; and
   a reliability verifying unit disposed between the integrated semiconductor circuit unit and the chip guard-ring, wherein the reliability verifying unit is configured to delay a reliability verifying signal to detect a fault while in a reliability detecting mode,
   wherein the reliability verifying unit comprises:
      a reliability-verifying-signal generating unit configured to generate the reliability verifying signal in response to a test mode signal,
      a reliability-verifying-signal transmitting unit configured to receive the reliability verifying signal from the reliability-verifying-signal generating unit, delay the reliability verifying signal, and transmit the delayed reliability verifying signal to an input of the reliability-verifying-signal generating unit, and
      a reliability-verifying-signal outputting unit configured to transmit the delayed reliability verifying signal to an output pad of the integrated semiconductor circuit unit.

2. The semiconductor device of claim 1, wherein the semiconductor device is configured to detect a pulse-width variation of the reliability verifying signal.

3. The semiconductor device of claim 1, wherein the reliability-verifying-signal transmitting unit comprises at least one inverter and at least one electrical conductor connected in series.

4. The semiconductor device of claim 3, wherein the reliability-verifying-signal transmitting unit further comprises at least one NMOS transistor having a drain connected to an input of the at least one inverter, a source connected to a ground voltage, and a gate connected to an electromigration mode signal, wherein the NMOS transistor applies a signal having a logic low state to the input of the at least one inverter while in an electromigration acceleration mode.

5. The semiconductor device of claim 1, wherein the reliability-verifying-signal transmitting unit is further disposed at at least one of a lower portion or a neighboring portion of a pad of the integrated semiconductor circuit unit.

6. The semiconductor device of claim 1, wherein the semiconductor device further comprises a plurality of layers and the reliability-verifying-signal transmitting unit is disposed at each of the plurality of layers.

7. The semiconductor device of claim 1, wherein the reliability-verifying-signal generating unit comprises a NAND gate.

8. The semiconductor device of claim 7, wherein the NAND gate comprises a first input connected to the test mode signal, a second input connected to a first inverter of the reliability-verifying-signal transmitting unit, and an output connected to a second inverter of the reliability-verifying-signal transmitting unit.

9. The semiconductor device of claim a 1, wherein the reliability-verifying-signal outputting unit further comprises a buffer connected to the output pad.

10. A method of verifying reliability of a semiconductor device, comprising:
    generating a reliability verifying signal;
    transmitting the reliability verifying signal to a reliability-verifying-signal transmitting unit;
    delaying the reliability verifying signal; and
    transmitting the delayed reliability verifying signal to a reliability-verifying-signal generating unit.

11. The method of claim 10, further comprising comparing a delayed reliability verifying signal from the semiconductor device while operating in a normal state with a delayed reliability verifying signal from the semiconductor device while operating in an abnormal state, wherein the normal state corresponds to the semiconductor device having no abnormalities and the abnormal state corresponds to the semiconductor device having at least one abnormality.

12. The method of claim 11, further comprising comparing a period of the delayed reliability verifying signal from the semiconductor device while operating in the normal state with a period of the delayed reliability verifying signal from the semiconductor device while operating in the abnormal state.

13. The method of claim 10, wherein the reliability verifying signal has a logic high state while a test mode signal has a logic low state.

14. The method of claim 10, wherein the reliability verifying signal has one of a logic high state or a logic low state while a test mode signal has a logic high state.

15. The method of claim 10, wherein the delayed reliability verifying signal is inverted by the reliability-verifying-signal transmitting unit while a test mode signal has a logic high state.

16. The method of claim 10, wherein an electromigration acceleration mode is enabled upon the reliability-verifying-signal transmitting unit receiving an electromigration mode signal having a logic high state.

17. The method of claim 16, wherein a continuous current flow is applied to the reliability-verifying-signal transmitting unit while in the electromigration acceleration mode.

18. The method of claim 16, wherein the electromigration acceleration mode is enabled for a predetermined time.

* * * * *